(12) United States Patent  
Ho et al.

(10) Patent No.: US 12,224,481 B2  
(45) Date of Patent: *Feb. 11, 2025

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Cheng-Lin Ho, Kaohsiung (TW); Chih-Cheng Lee, Kaohsiung (TW); Chun Chen Chen, Kaohsiung (TW); Yuanhao Yu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/118,738

(22) Filed: Mar. 7, 2023

(65) Prior Publication Data

US 2023/0223676 A1 Jul. 13, 2023

Related U.S. Application Data

(63) Continuation of application No. 16/506,654, filed on Jul. 9, 2019, now Pat. No. 11,600,901.

(51) Int. Cl.
*H01Q 1/22* (2006.01)
*H01L 23/31* (2006.01)
(Continued)

(52) U.S. Cl.
CPC ............ *H01Q 1/2283* (2013.01); *H01L 23/66* (2013.01); *H01Q 1/40* (2013.01); *H01Q 21/0093* (2013.01);
(Continued)

(58) Field of Classification Search
CPC ........ H01Q 1/2283; H01Q 1/40; H01Q 1/526; H01Q 21/061; H01Q 21/0093;
(Continued)

(56) References Cited

U.S. PATENT DOCUMENTS 9,985,346 B2   5/2018  Baks et al.
11,600,901 B2 * 3/2023  Ho ......................... H01Q 1/526
(Continued)

OTHER PUBLICATIONS

Final Office Action for U.S. Appl. No. 16/506,654, issued Sep. 2, 2022, 9 pages.
(Continued)

*Primary Examiner* — Robert Karacsony
(74) *Attorney, Agent, or Firm* — FOLEY & LARDNER LLP

(57) ABSTRACT

A semiconductor device package includes a substrate and an antenna module. The substrate has a first surface and a second surface opposite to the first surface. The antenna module is disposed on the first surface of the substrate with a gap. The antenna module has a support and an antenna layer. The support has a first surface facing away from the substrate and a second surface facing the substrate. The antenna layer is disposed on the first surface of the support. The antenna layer has a first antenna pattern and a first dielectric layer.

10 Claims, 13 Drawing Sheets

(51) Int. Cl.
  *H01L 23/66* (2006.01)
  *H01Q 1/40* (2006.01)
  *H01Q 21/00* (2006.01)
  *H01Q 21/06* (2006.01)

(52) U.S. Cl.
  CPC .. *H01L 23/3128* (2013.01); *H01L 2223/6677* (2013.01); *H01Q 21/061* (2013.01)

(58) Field of Classification Search
  CPC . H01L 21/6835; H01L 23/66; H01L 23/3128; H01L 23/552; H01L 24/16; H01L 2221/68345; H01L 2221/68359; H01L 2223/6677; H01L 2224/16227; H01L 2924/3025; H01L 2924/15321; H01L 2924/15331; H01L 2924/181
  See application file for complete search history.

(56) References Cited

U.S. PATENT DOCUMENTS

| | | | |
|---|---|---|---|
| 2018/0331027 A1* | 11/2018 | Chen | H01L 23/49816 |
| 2019/0089038 A1 | 3/2019 | Liao et al. | |
| 2019/0288382 A1 | 9/2019 | Kamgaing et al. | |
| 2020/0035625 A1* | 1/2020 | Wang | H01L 23/552 |
| 2020/0259269 A1* | 8/2020 | Kim | H01Q 9/0414 |
| 2020/0303806 A1* | 9/2020 | Wu | H01L 23/49816 |
| 2020/0335458 A1 | 10/2020 | Chen et al. | |

OTHER PUBLICATIONS

Non-Final Office Action for U.S. Appl. No. 16/506,654, issued Jun. 18, 2021, 10 pages.

Notice of Allowance for U.S. Appl. No. 16/506,654, issued Nov. 3, 2022, 6 pages.

* cited by examiner

SEMICONDUCTOR DEVICE PACKAGE AND METHOD OF MANUFACTURING THE SAME

CROSS-REFERENCE TO RELATED APPLICATION

This application is a continuation of U.S. patent application Ser. No. 16/506,654 filed Jul. 9, 2019, now issued as U.S. Pat. No. 11,600,901, the contents of which is incorporated herein by reference in its entirety.

BACKGROUND

1. Technical Field

The present disclosure relates to a semiconductor device package and a method of manufacturing the same, and to a semiconductor device package including an antenna and a method of manufacturing the same.

2. Description of the Related Art

Wireless communication devices, such as cell phones, typically include antennas for transmitting and receiving radio frequency (RF) signals. In recent years, with the continuous development of mobile communication and the pressing demand for high data rate and stable communication quality, relatively high frequency wireless transmission (e.g., 28 GHz or 60 GHz) has become one of the most important topics in the mobile communication industry.

In a comparative wireless communication device, antennas and circuits (e.g., radio reference (RF) circuits or digital circuits) are disposed on a printed circuit board (PCB) or a substrate. However, it is difficult to fine turn the antennas. In addition, the entire wireless communication device fails if one of the antennas or the circuits fails, which would reduce the yield rate for manufacturing the wireless communication device.

SUMMARY

In accordance with some embodiments of the present disclosure, a semiconductor device package includes a substrate and an antenna module. The substrate has a first surface and a second surface opposite to the first surface. The antenna module is disposed on the first surface of the substrate with a gap. The antenna module has a support and an antenna layer. The support has a first surface facing away from the substrate and a second surface facing the substrate. The antenna layer is disposed on the first surface of the support. The antenna layer has a first antenna pattern and a first dielectric layer.

In accordance with some embodiments of the present disclosure, a semiconductor device package includes a substrate and an antenna module. The substrate has a first surface and a second surface opposite to the first surface. The antenna module is disposed on the first surface of the substrate with a gap. The antenna module includes a support, an antenna layer, a circuit layer and an electrical contact. The support has a first surface facing away from the substrate and a second surface facing the substrate. The antenna layer is disposed on the first surface of the support. The antenna layer has a first antenna pattern and a first dielectric layer. The circuit layer includes a second dielectric layer disposed on the second surface of the support, a second antenna pattern disposed on the second dielectric layer and a plurality of pads surrounded by the second dielectric layer. At least one of the pads is electrically connected to the second antenna pattern. The electrical contact electrically connects the pads to the substrate.

In accordance with some embodiments of the present disclosure, a method of manufacturing a semiconductor device package includes (a) forming an antenna layer on a carrier, the antenna layer having an antenna pattern and a dielectric layer covering a first portion of the antenna pattern and exposing a second portion of the antenna pattern; (b) providing a support on the carrier to form an antenna module; and (c) disposing the antenna module on a substrate by an electrical contact. The support is between the antenna layer and the substrate. The support is spaced apart from the substrate by the electrical contact.

Figure 1:
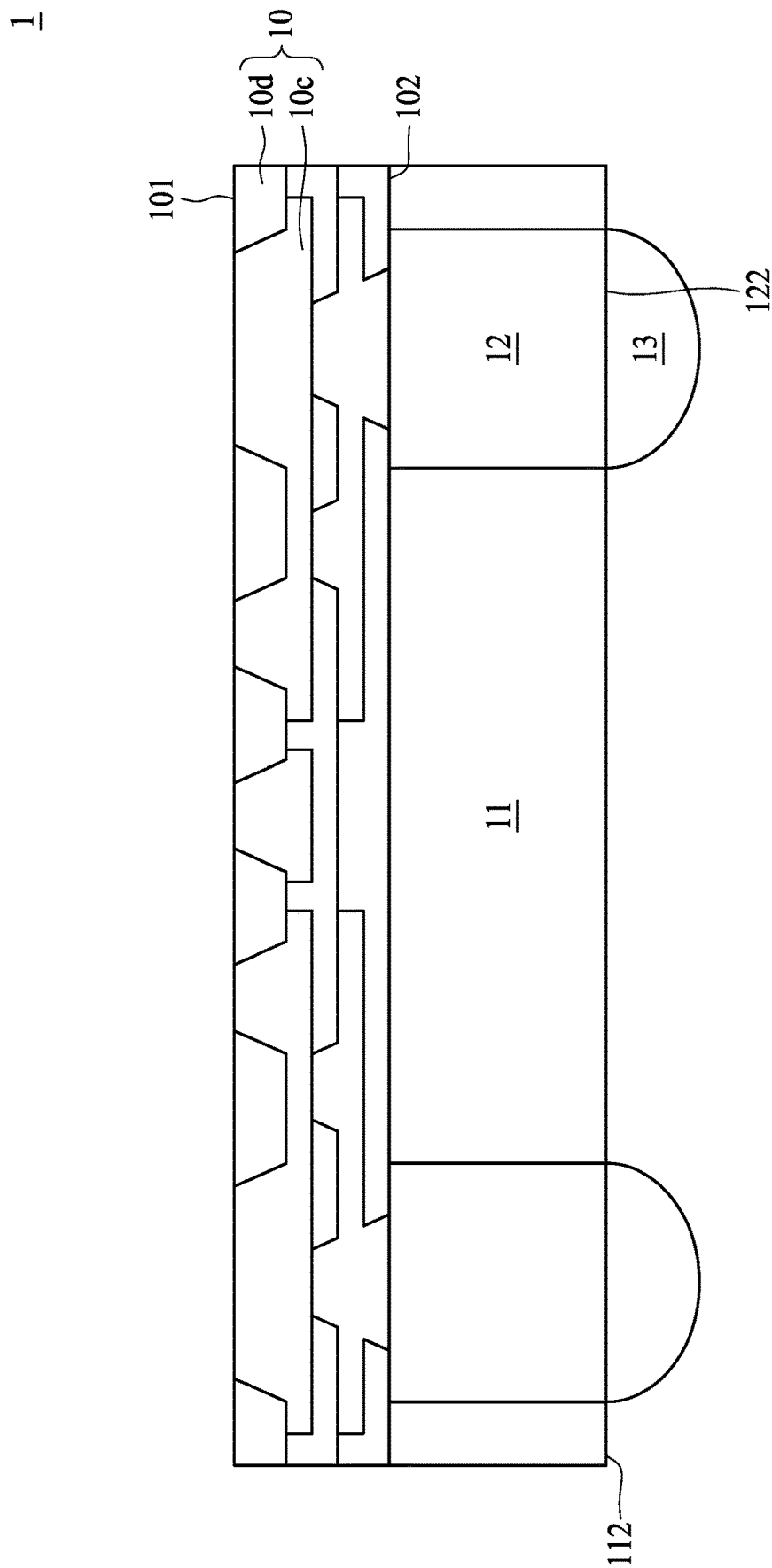
FIG. 1 illustrates a cross-sectional view of an antenna module in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1 illustrates a cross-sectional view of an antenna module 1 in accordance with some embodiments of the present disclosure. The antenna module 1 includes an antenna layer 10, a package body 11 (also can be referred to as a "support"), a conductive pillar 12 and an electrical contact 13.

The antenna layer 10 includes an antenna pattern 10c and a dielectric layer 10d. A portion of the antenna pattern 10c is covered or encapsulated by the dielectric layer 10d and the other portion of the antenna pattern 10c is exposed from the dielectric layer 10d. For example, the antenna layer 10 (or the dielectric layer 10d) has a surface 101 and a surface 102 opposite to the surface 101, and a portion of the antenna pattern 10c is exposed from the surface 101 and the surface 102 of the antenna layer 10 (or the dielectric layer 10d).

In some embodiments, the antenna pattern 10c is, or includes, a conductive material such as a metal or metal alloy. Examples of the conductive material include gold (Au), silver (Ag), aluminum (Al), copper (Cu), or an alloy thereof. In some embodiments, the antenna pattern 10c may include a single antenna element. In some embodiments, the antenna pattern 10c may include multiple antenna elements. For example, the antenna pattern 10c may include an M×N array of antenna elements, where M or N is an integer greater than 1. In some embodiments, M can be the same as or different from N depending on design specifications. In some embodiments, the antenna pattern 10c may be a patch antenna, a dipole antenna, a horn antenna, a loop antenna, a planar inverted F antenna (PIFA) or any other antennas.

In some embodiments, the antenna pattern 10c includes a plurality of conductive layers. A width of each conductive layer of the antenna pattern 10c is less than 20 micrometer (μm). For example, the width of each conductive layer of the antenna pattern 10c is less than 10 μm. For example, the width of each conductive layer of the antenna pattern 10c is less than 5 μm. For example, the width of each conductive layer of the antenna pattern 10c is equal to or less than 2 μm. In some embodiments, a distance between two adjacent conductive layers is less than 20 μm. For example, the distance between two adjacent conductive layers is less than 10 μm. For example, the distance between two adjacent conductive layers is less than 5 μm. For example, the distance between two adjacent conductive layers is equal to or less than 2 μm. In some embodiments, a tolerance of the width of the conductive layers of the antenna pattern 10c is less than 3 μm. For example, the tolerance of the width of the conductive layers of the antenna pattern 10c is less than 1 μm. For example, the tolerance of the width of the conductive layers of the antenna pattern 10c is equal to or less than 0.5 μm.

In some embodiments, the dielectric layer 10d may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets. In some embodiments, there may be a plurality of dielectric layers arranged in a stacked structure, and the number of the dielectric layers can be adjusted or changed depending on different design specifications. In some embodiments, the dielectric layer 10d may include a photosensitive material, such as polyimide (PI).

The conductive pillar 12 (e.g., Cu pillar) is disposed on the surface 102 of the antenna layer 10 and electrically connected to the antenna pattern 10c exposed from the dielectric layer 10d. In some embodiments, the conductive pillar 12 is electrically connected to a feeding point of the antenna pattern 10c for signal transmission between the antenna layer 10 and other electronic components (e.g., RF circuits, passive elements or circuit boards). In some embodiments, the number of the conductive pillar 12 can be adjusted depending on different design specifications. In some embodiments, The package body 11 is disposed on the surface 102 of the antenna layer 10. The package body 11 covers a portion of the conductive pillar 12 and exposes the other portion of the conductive pillar 12 for electrical connections. For example, a surface 122 of the conductive pillar 12 is exposed from a surface 112 the package body 11. For example, the surface 122 of the conductive pillar 12 is substantially coplanar with the surface 112 of the package body 11. The electrical contact 13 (e.g., a solder ball) is disposed on the surface 122 of the conductive pillar 12 exposed from the package body 11. The package body 11 includes a material having a relatively low dielectric constant. In some embodiments, the package body 11 includes an epoxy resin having fillers, a molding compound (e.g., an epoxy molding compound or other molding compound), a polyimide, a phenolic compound or material, a material with a silicone dispersed therein, or a combination thereof.

In some embodiments, the package body 11 and the dielectric layer 10d of the antenna layer 10 are formed of different materials. In some embodiments, a thickness of the package body 11 is different from a thickness of the dielectric layer 10d. For example, the thickness of the package body 11 is greater than the thickness of the dielectric layer 10d. For example, the thickness of the package body 11 is equal to or greater than 100 μm (e.g., 200 μm). For example, the thickness of the dielectric layer 10d is equal to or less than 50 μm (e.g., 20 μm).

Figure 2:
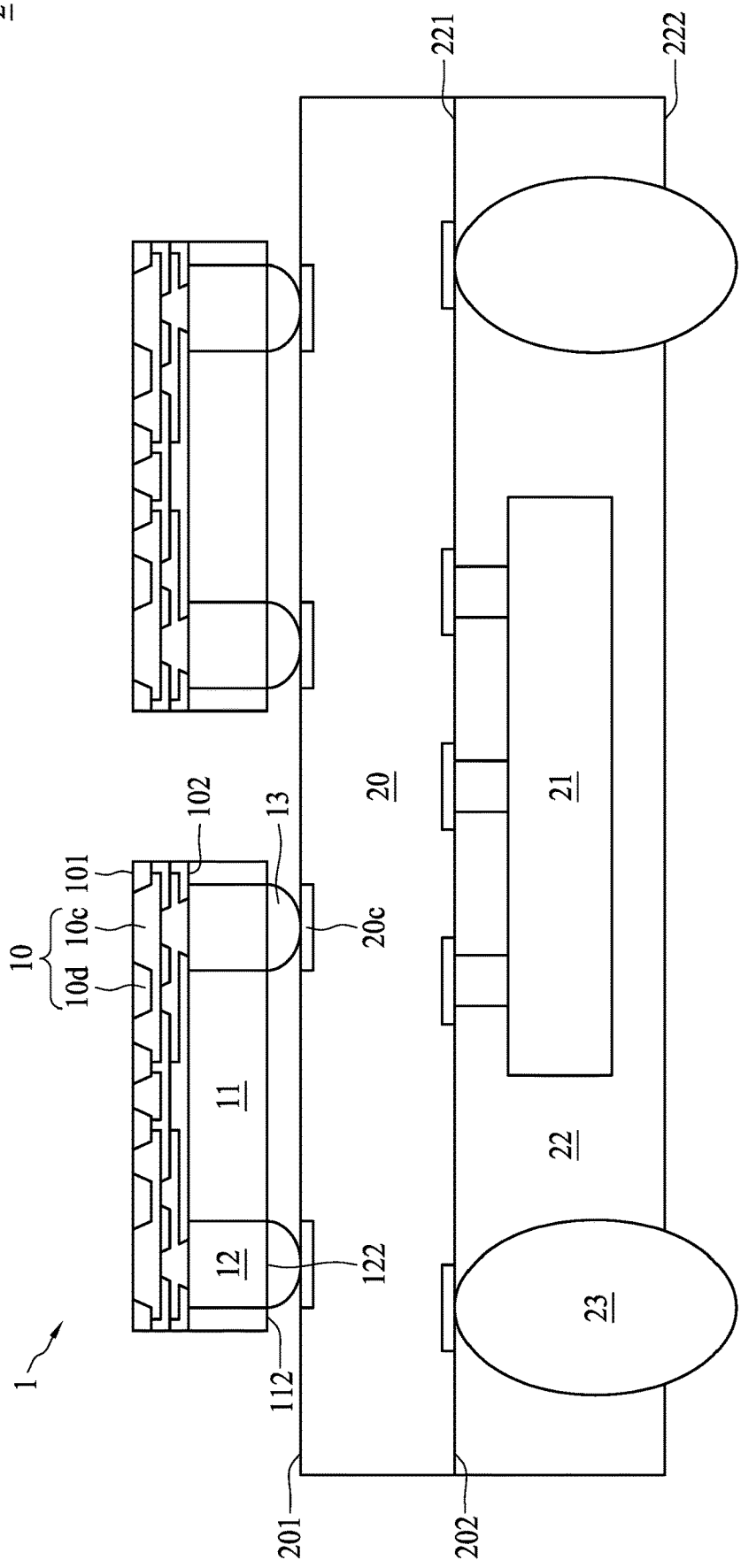
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 includes a substrate 20, the antenna module 1 as shown in FIG. 1, an electronic component 21, a package body 22 and an electrical contact 23. In some embodiments, the semiconductor device package 2 may be a wireless communication device or parts of a wireless communication device.

The substrate 20 may be, for example, a printed circuit board, such as a paper-based copper foil laminate, a composite copper foil laminate, or a polymer-impregnated glass-fiber-based copper foil laminate. The substrate 20 may include an interconnection structure (or electrical connection), such as a redistribution layer (RDL) or a grounding element. The substrate 20 has a surface 201 and a surface 202 opposite to the surface 201. The substrate 20 may include one or more conductive pads 20c in proximity to, adjacent to, or embedded in and exposed at the surfaces 201 and 202 of the substrate 20. The substrate 20 may include a solder resist (not shown in FIG. 2) on the surface 201 and/or 202 of the substrate 20 to fully expose or to expose at least a portion of the conductive pads 20c for electrical connections. For example, the solder resist may cover a portion of the conductive pads 20c.

The antenna module 1 is disposed on the surface 201 of the substrate 20 and electrically connected to the conductive pads 20c of the substrate 20 through the electrical contact 13. The package body 11 of the antenna module 1 is disposed between the antenna layer 10 of the antenna module 1 and the substrate 20. For example, the antenna layer 10 is closer to the surface of the package body 11 facing away from the substrate 20 than the surface 112 of the package body 11. The surface 112 of the package body 11 of the antenna module 1 faces the surface 201 of the substrate 20 and spaced apart from the surface 201 of the substrate 20. For example, there is a gap (e.g., air gap) between the surface 112 of the package body 11 and the surface 201 of the substrate 20. In some embodiments, the number of the antenna modules 1 can be changed depending on different design specifications. For example, there may be an M×N array of antenna modules 1 disposed on the surface 201 of the substrate, where M or N is an integer greater than 1.

The electronic component 21 is disposed on the surface 202 of the substrate 20 and electrically connected to the conductive pads 20c of the substrate 20. The electronic component 21 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. For example, the electronic component 21 may include a RF circuit, a digital circuit and/or a mixed-signal circuit. In some embodiments, the number or the type of the electronic components 21 can be changed depending on different design specifications.

The electrical contact 23 (e.g. a solder ball) is disposed on the surface 202 of the substrate and electrically connected to the conductive pads 20c. The electrical contact 23 can provide electrical connections between the semiconductor device package 2 and external components (e.g. external circuits or circuit boards). In some embodiments, the electrical contact 23 includes a controlled collapse chip connection (C4) bump, a ball grid array (BGA) or a land grid array (LGA).

The package body 22 is disposed on the surface 202 of the substrate 20. The package body 22 covers the electronic component 21 and a portion of the electrical contact 23. The other portion of the electrical contact 23 is exposed from the package body 22 (e.g., exposed from the surface Paragraph 2 of Article 22 of the Patent Act of the package body 22) for electrical connections. In some embodiments, the package body 22 includes an epoxy resin having fillers, a molding compound (e.g., an epoxy molding compound or other molding compound), a polyimide, a phenolic compound or material, a material with a silicone dispersed therein, or a combination thereof.

A conductive layer 10a is disposed on the surface 101 of the substrate 10. In some embodiments, the conductive layer 10a is formed of or includes gold (Au), silver (Ag), aluminum (Al), copper (Cu), or an alloy thereof. In some embodiments, the conductive layer 10a acts as a ground layer or a RF layer for the antenna pattern 12, 13 or 14. An isolation layer 10b (e.g., solder mask or solder resist) is disposed on the surface 101 of the substrate 10 to protect the conductive layer 10a.

In some comparative wireless communication devices, RF and digital circuits are disposed on a PCB or a substrate, and antenna patterns are formed on the PCB or the substrate. However, if the performance of the antenna patterns cannot achieve the desired specifications, it is difficult to adjust (fine-tune) the performance of the antenna patterns. In addition, the entire wireless communication device would be determined to be failure, even if one of the antennas or the circuits fails, which would reduce the yield rate for manufacturing the wireless communication device. In accordance with the embodiments as shown in FIG. 2, the antenna module 1 is a separated module, and the performance of the antenna module 1 can be adjusted (fine-tune) flexibly without affecting the electronic component 21 or the substrate 20. In addition, if one of the antenna module 1 or the electronic component 21 has a defect, they can be changed or substituted individually. This can increase the yield rate for manufacturing the wireless communication device.

In some embodiments, the antenna module 1 can be replaced by a substrate antenna (e.g., an antenna pattern formed on a substrate by a substrate built-up process), which can also increase the flexibility for designing the wireless communication device compared with the comparative wireless communication devices. However, the width, pitch and roughness of the antenna pattern of the substrate antenna are relatively large, which would adversely affect the performance of the substrate antenna. In the embodiments as shown in FIG. 1, since the antenna module 1 may be formed by a wafer-level redistribution layer (RDL) process (which will be described in the following paragraphs), the width, pitch and roughness of the antenna pattern 10c of the antenna module 1 are relatively small, which would improve the performance of the antenna module 1. For example, in the case that both the package body 11 of the antenna module 1 and the substrate antenna have a same thickness (e.g., 100 μm) and is operating in a same frequency (e.g., 77 GHz), the antenna module 1 and the substrate antenna may have similar gain, but the antenna module 1 can have a bandwidth (e.g., 2.4 GHz-3 GHz) broader than the bandwidth (e.g., 2 GHz) of the substrate antenna.

In addition, due to process constraint, the antenna pattern of the substrate antenna has a relative larger variation or tolerance compared with the antenna pattern 10c of the antenna module 1. For example, the antenna pattern of the substrate antenna may have the tolerance of about 110 μm while the antenna pattern 10c of the antenna module 1 has the tolerance less than 25 μm. Hence, compared with the substrate antenna, the antenna module 1 may have a smaller conductive pad to connect to a via, which would reduce the area of the antenna module 1.

Furthermore, the thickness of the package body 11 of the antenna module 1 can be changed or adjusted to control the performance of the antenna module 1. Compared with the substrate antenna, which should change its thickness by replacing the substrate with another substrate, it is easier to change the thickness of the package body 11 (e.g., may be performed by grinding). This would increase the flexibility to design the antenna module 1 to meet the desired specification.

Figure 3:
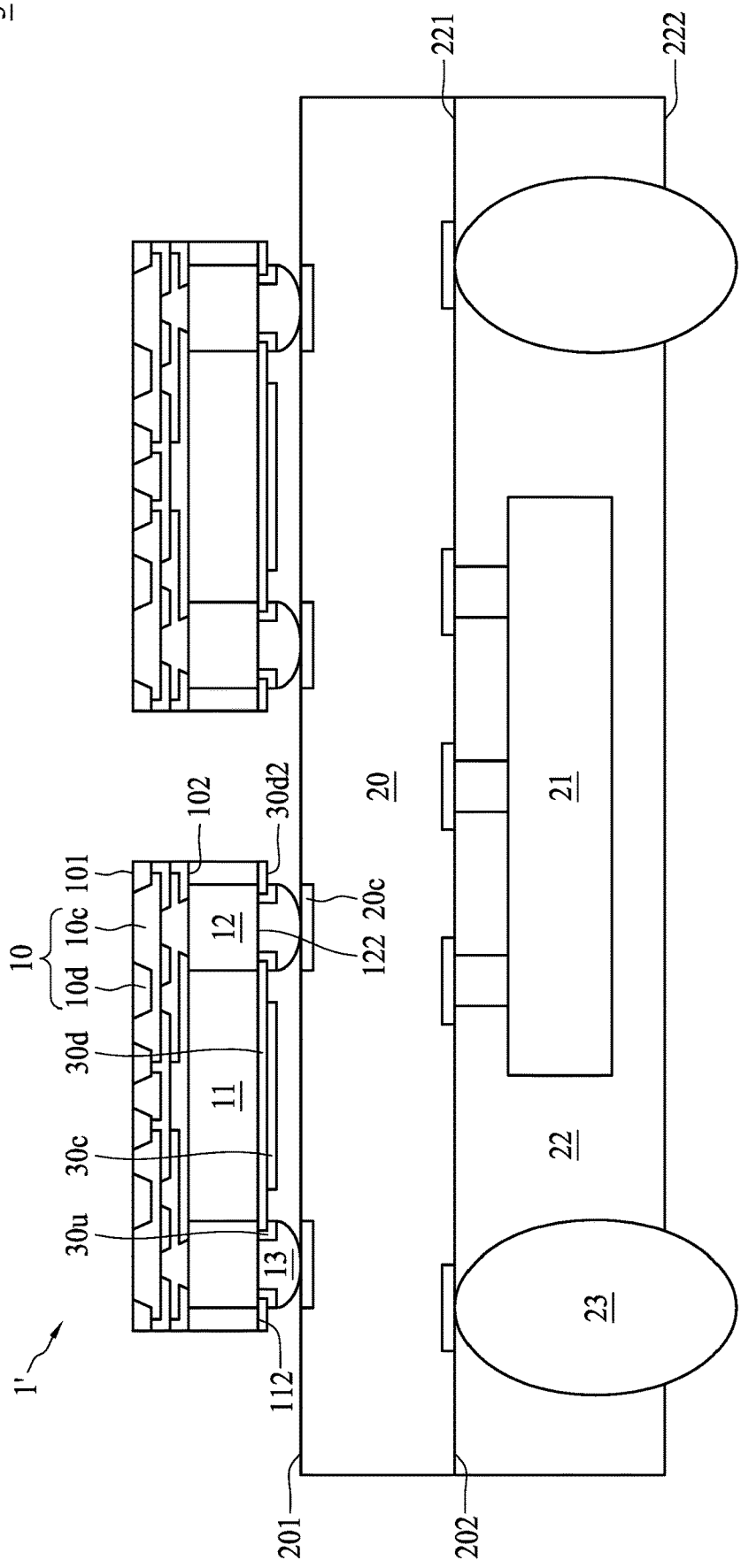
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 2 in FIG. 2 except that in FIG. 3, the antenna module 1 is replaced by an antenna module 1'. The antenna module 1' is similar to the antenna module 1 in FIG. 1, and the differences therebetween are described below.

The antenna module 1' comprises a circuit layer disposed on the surface 112 of the package body 11. The circuit layer includes a dielectric layer 30d, a conductive layer 30c and an under bump metallurgy (UBM) layer 30u (which may include a plurality of conductive pads surrounded by the dielectric layer 30d). In some embodiments, at least one of the conductive pads is electrically connected to the conductive layer 30c. The dielectric layer 30d is disposed on the surface 112 of the package body 11. The dielectric layer 30d has an opening to expose the surface 122 of the conductive pillar 12. In some embodiments, the dielectric layer 30d is similar to the dielectric layer 10d, and the properties of the dielectric layer 10d can be applicable to the dielectric layer 30d. the UBM layer 30u is disposed on a surface 30d2 of the dielectric layer 30d and extends within the opening of the dielectric layer 30d to be in contact with the surface 122 of the conductive pillar 12. The electrical contact 13 is disposed on the UBM layer 30u, and electrically connects the antenna module 1' to the substrate 20.

Figure 4:
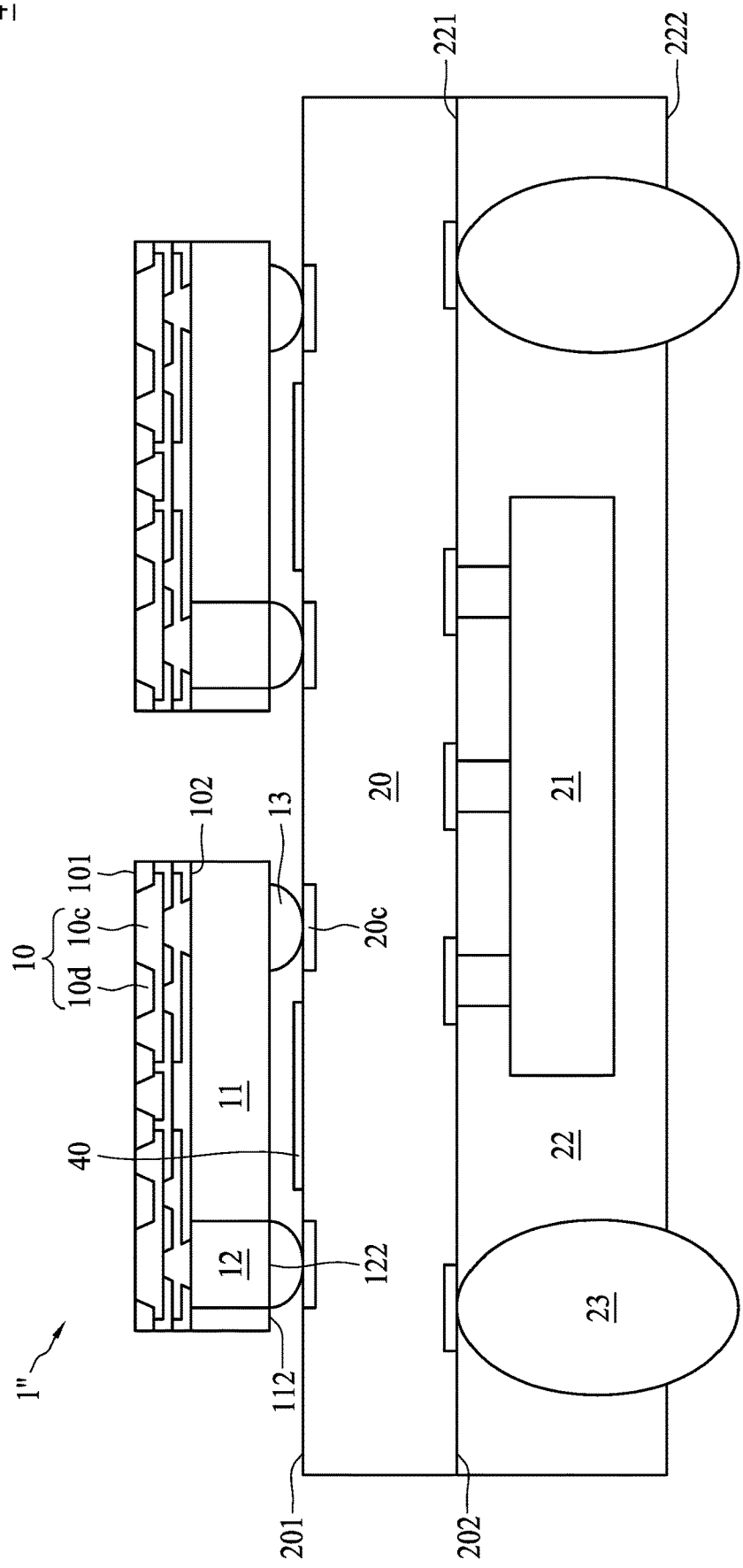
FIG. 4 illustrates a cross-sectional view of a semiconductor device package in accordance with some embodiments of the present disclosure.

The conductive layer 30c is disposed on the surface 30d2 of the dielectric layer 30d. In some embodiments, the conductive layer 30c may act as a ground layer for the antenna layer 10, and the signal transmission for the antenna layer 10 can be achieved by the conductive pillar 12. In the case that the conductive layer 30c is connected to ground, the conductive layer 30c can act as a shielding layer to prevent the electromagnetic interference (EMI) between the antenna module 1' and the electronic component 21. In some embodiments, the conductive layer 30c may act as a RF layer, which is magnetically coupled to the antenna layer 10 for signal transmission. In such embodiments, the conductive pillar 12 may be omitted or remain depending on different design specifications. The conductive layer 30c may be electrically connected to the conductive pads of the FIG. 4 illustrates a cross-sectional view of a semiconductor device package 4 in accordance with some embodiments of the present disclosure. The semiconductor device package 4 is similar to the semiconductor device package 2 in FIG. 2, and the differences therebetween are described below.

In FIG. 4, the antenna module 1 is replaced by an antenna module 1". The antenna module 1" is similar to the antenna module 1 in FIG. 1, except that the antenna module 1" solely includes one conductive pillar 12 connected to the feeding point of the antenna layer for signal transmission. The semiconductor device package 4 further includes a conductive layer 40 disposed on the surface 201 of the substrate 20 and spaced apart from the antenna module 1". The conductive layer 40 may have an antenna pattern including a first portion and a second portion, wherein the first portion is magnetically coupled to the antenna layer 10 for signal transmission and the second portion is grounded. In some embodiment, the conductive layer 40 may be a slot antenna.

To achieve a high performance of the coupling between the antenna layer 10 and the conductive layer 40, an alignment between the antenna pattern 10c of the antenna layer 10 and the conductive layer 40 is a critical issue. In a substrate antenna, since the tolerance of the width and pitch of the antenna pattern is relatively large, it is difficult to achieve alignment between two antenna patterns. As mentioned above, the tolerance of the width and pitch of the antenna pattern 10c of the antenna module 1 (or antenna module 1") is relatively small. It is easier to align the antenna pattern 10c of the antenna module 1" with the conductive layer 40, which would further improve the performance of the semiconductor device package 4.

FIG. 5A, FIG. 5B, FIG. 5C, FIG. 5D, FIG. 5E and FIG. 5F illustrate a method for manufacturing an antenna module in accordance with some embodiments of the present disclosure. In some embodiments, the method in FIG. 5A, FIG. 5B, FIG. 5C, FIG. 5D, FIG. 5E and FIG. 5F can be used to manufacture the antenna module 1 as shown in FIG. 1. In other embodiments, the method in FIG. 5A, FIG. 5B, FIG. 5C, FIG. 5D, FIG. 5E and FIG. 5F can be used to manufacture other antenna modules.

Figure 5A:
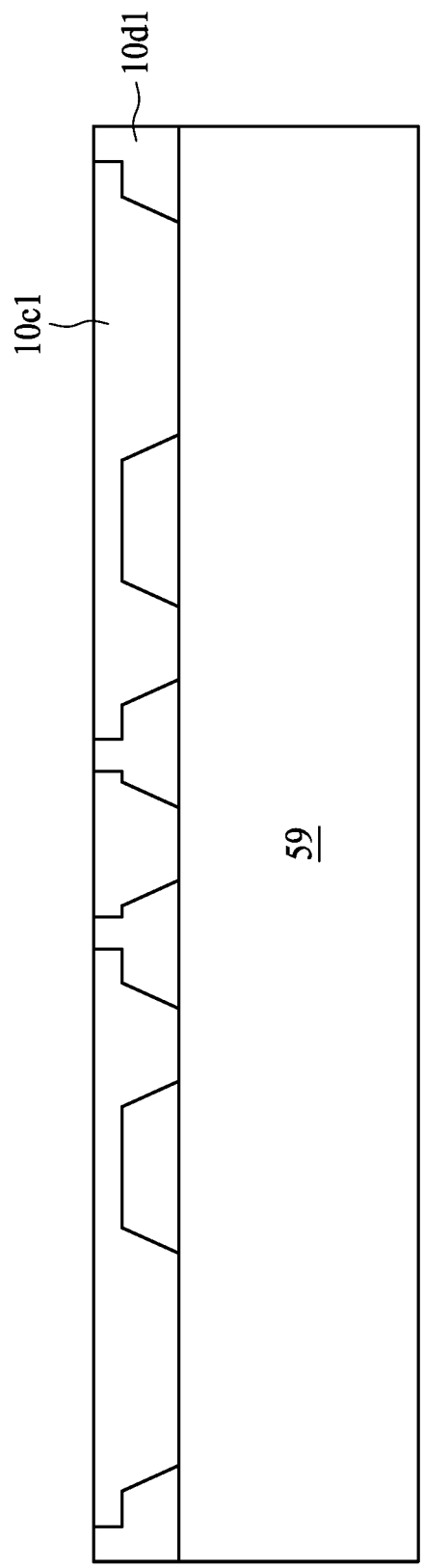
FIG. 5A, FIG. 5B, FIG. 5C, FIG. 5D, FIG. 5E and FIG. 5F illustrate a method for manufacturing an antenna module in accordance with some embodiments of the present disclosure.

Referring to FIG. 5A, a carrier 59 is provided. In some embodiments, the carrier 59 has an adhesive layer (e.g., tape or adhesive film) disposed on the carrier 59. A dielectric layer 10d1 is formed on the carrier 59. The dielectric layer 10d1 has one or more openings to expose the carrier 59 (or the adhesive layer). A conductive layer 10c1 is formed on the dielectric layer 10d1 and within the openings.

Figure 5B:
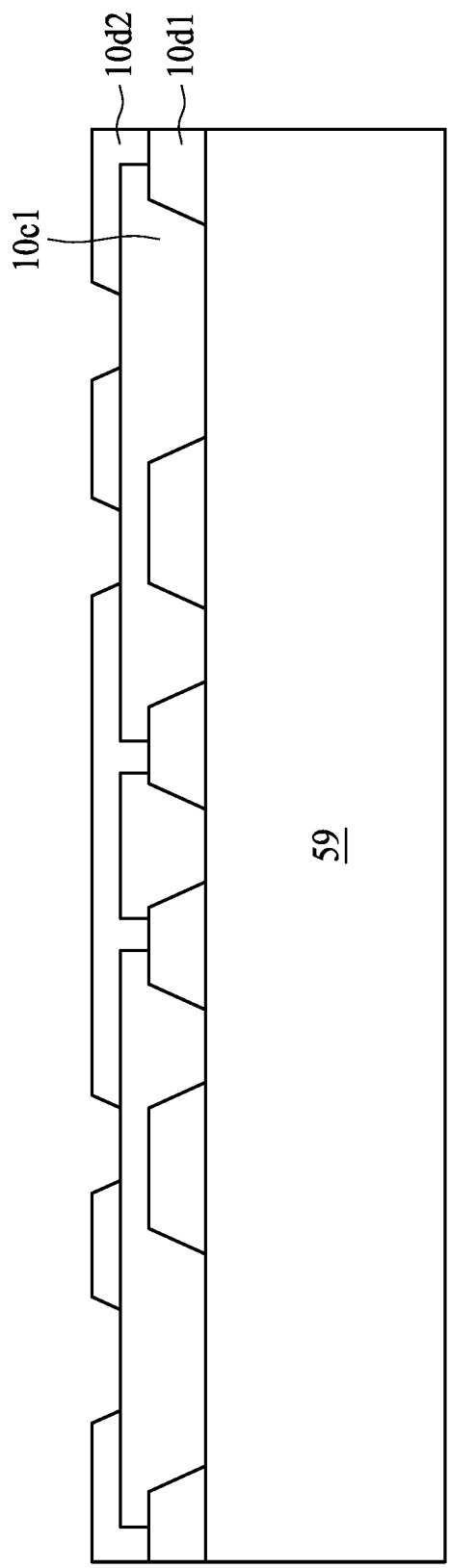

Referring to FIG. 5B, a dielectric layer 10d2 is formed on the dielectric layer 10d1. The dielectric layer 10d2 covers a portion of the conducive layer 10c1. The dielectric layer 10d2 has one or more openings to expose a portion of the conductive layer 10c1.

Figure 5C:
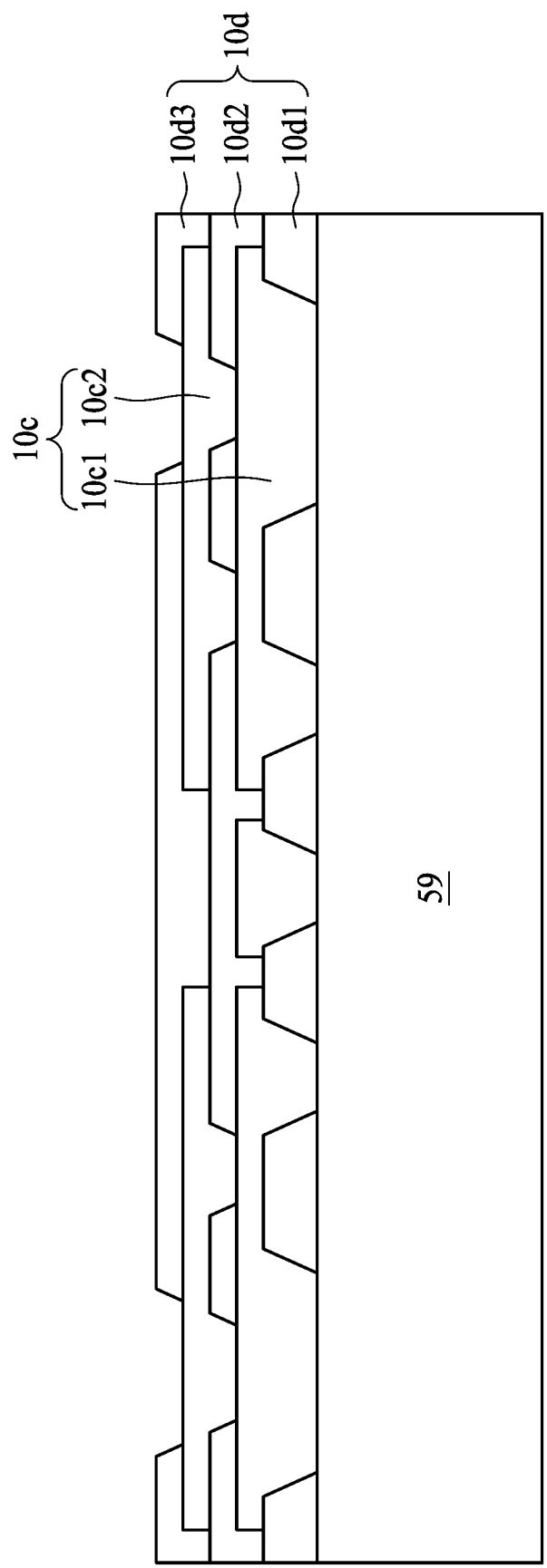

Referring to FIG. 5C, a conductive layer 10c2 is formed on the dielectric layer 10d2 and within the openings to contact the conductive layer 10c1 exposed from the dielectric layer 10d2. A dielectric layer 10d3 is formed on the dielectric layer 10d2. The dielectric layer 10d3 covers a portion of the conducive layer 10c2. The dielectric layer 10d3 has one or more openings to expose a portion of the conductive layer 10c2. In some embodiments, the dielectric layers 10d1, 10d2 and 10d3 are collectively referred to as the dielectric layer 10d. In some embodiments, the conductive layers 10c1 and 10c2 are connected to define the antenna pattern 10c.

Figure 5D:
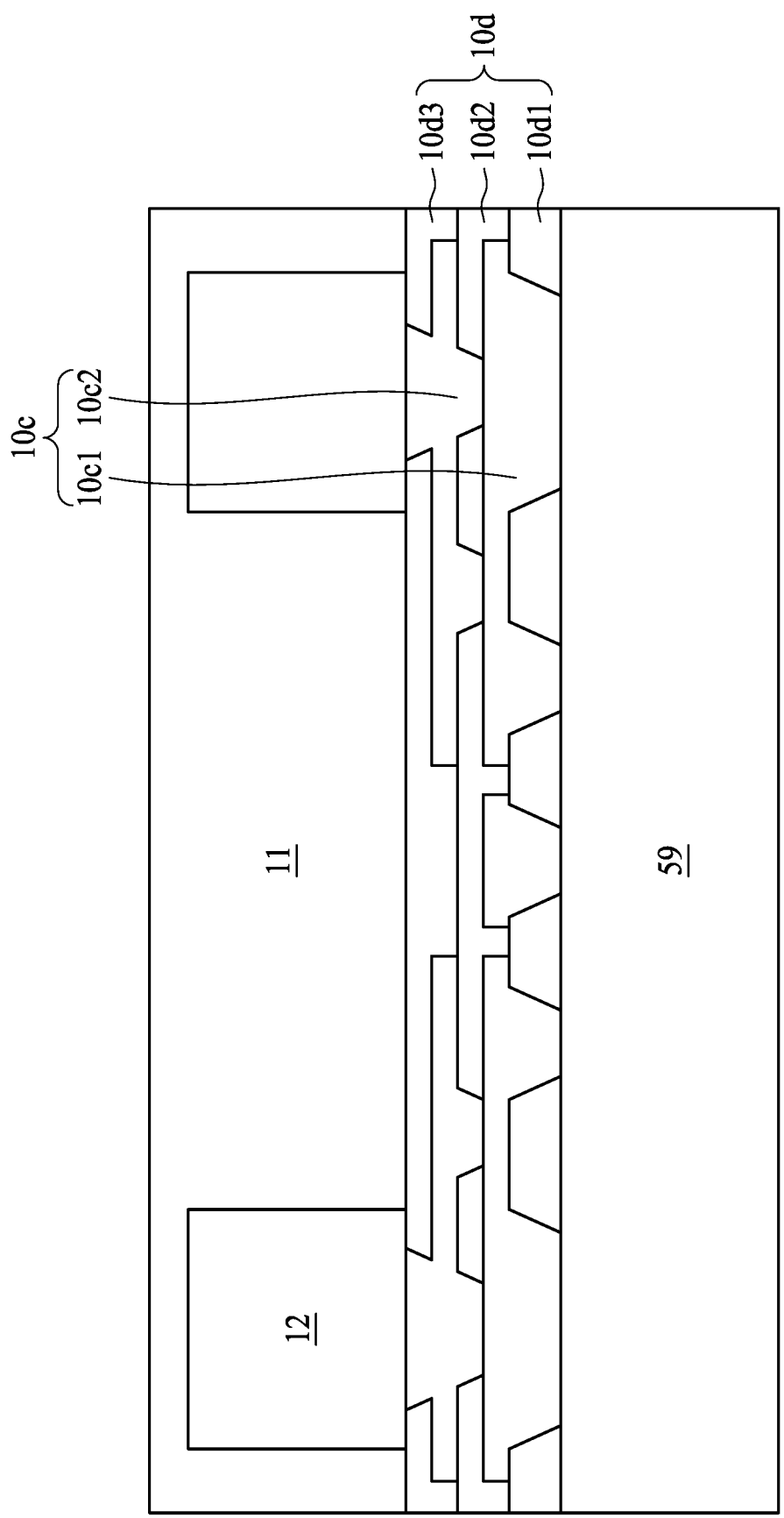

Referring to FIG. 5D, a conductive pillar 12 is formed on the conductive layer 10c2 exposed from the dielectric layer 10d3. A package body 11 is then formed on the dielectric layer 10d. The package body 11 may fully cover the conductive pillar 12 (e.g., a top surface and lateral surfaces of the conductive pillar 12). The package body 11 may be formed by molding techniques, such as transfer molding, compression molding or any other suitable processes.

Figure 5E:
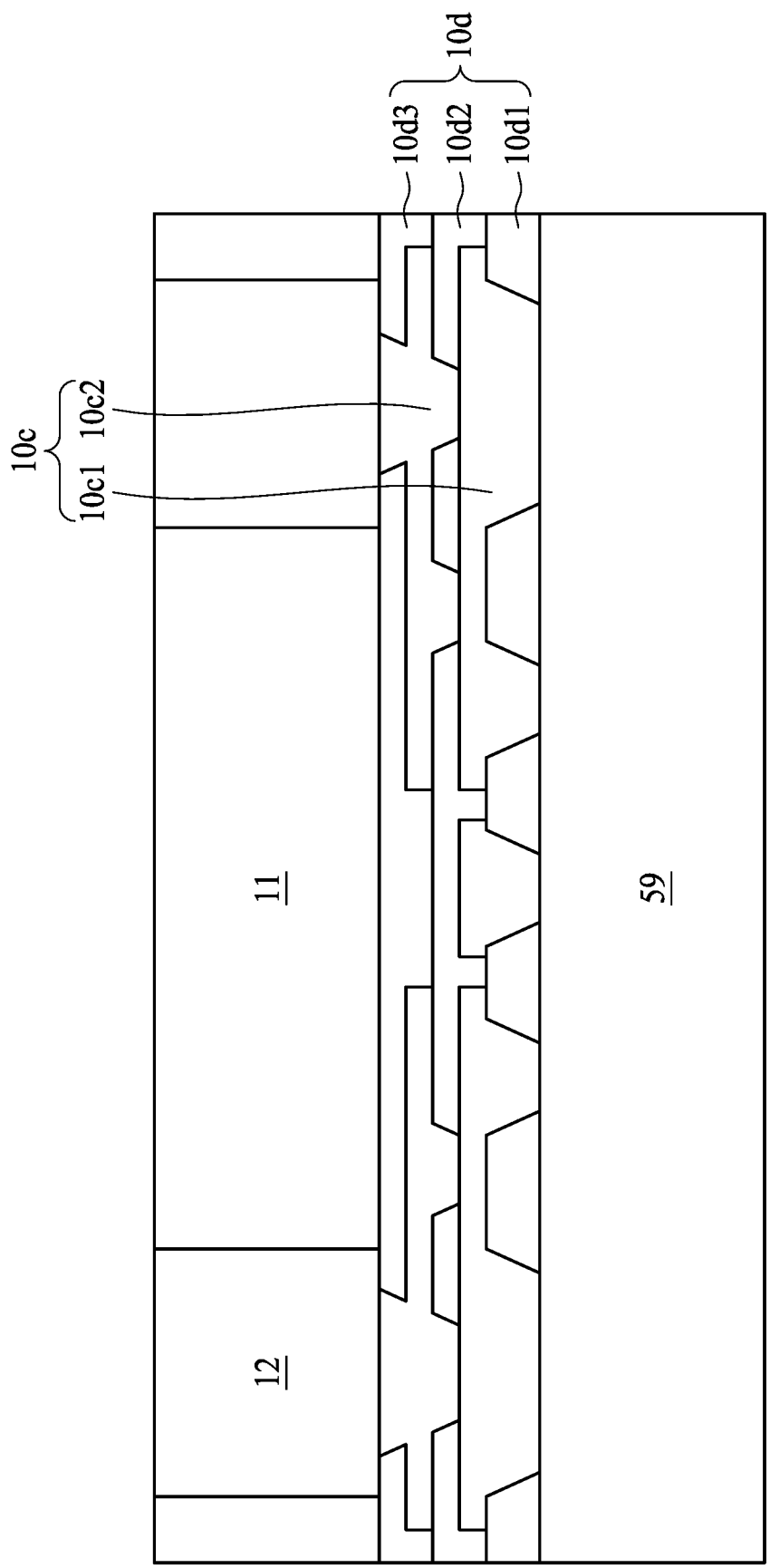

Referring to FIG. 5E, a portion of the package body 11 is removed to expose the top surface of the conductive pillar 12. In some embodiments, a portion of the conductive pillar 12 can be removed as well. In some embodiments, the package body 11 can be removed by, for example, grinding or any other suitable processes.

Figure 5F:
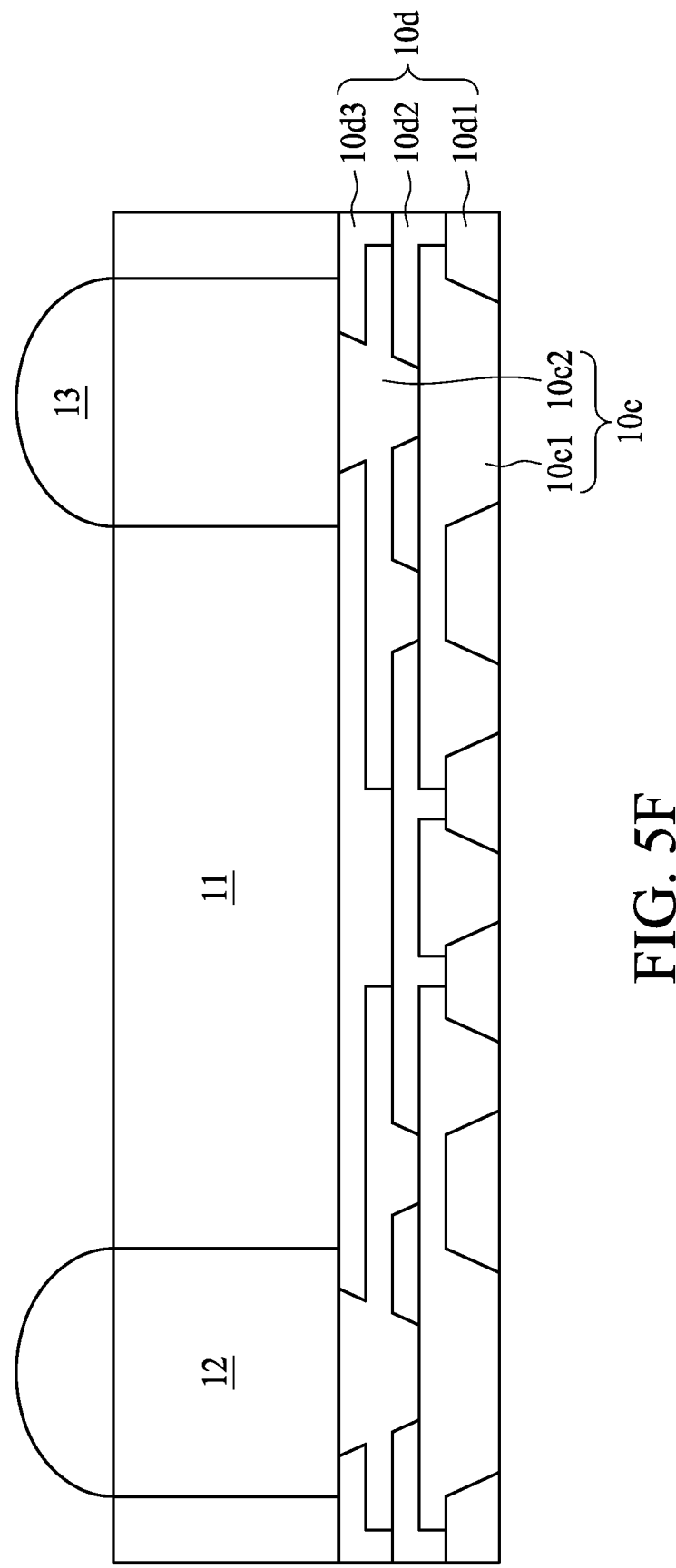

Referring to FIG. 5F, an electrical contact 13 is formed on the top surface of the conductive pillar 12 exposed from the package body 11. The carrier 59 is then removed to form the antenna module 1 as shown in FIG. 1.

Figure 6A:
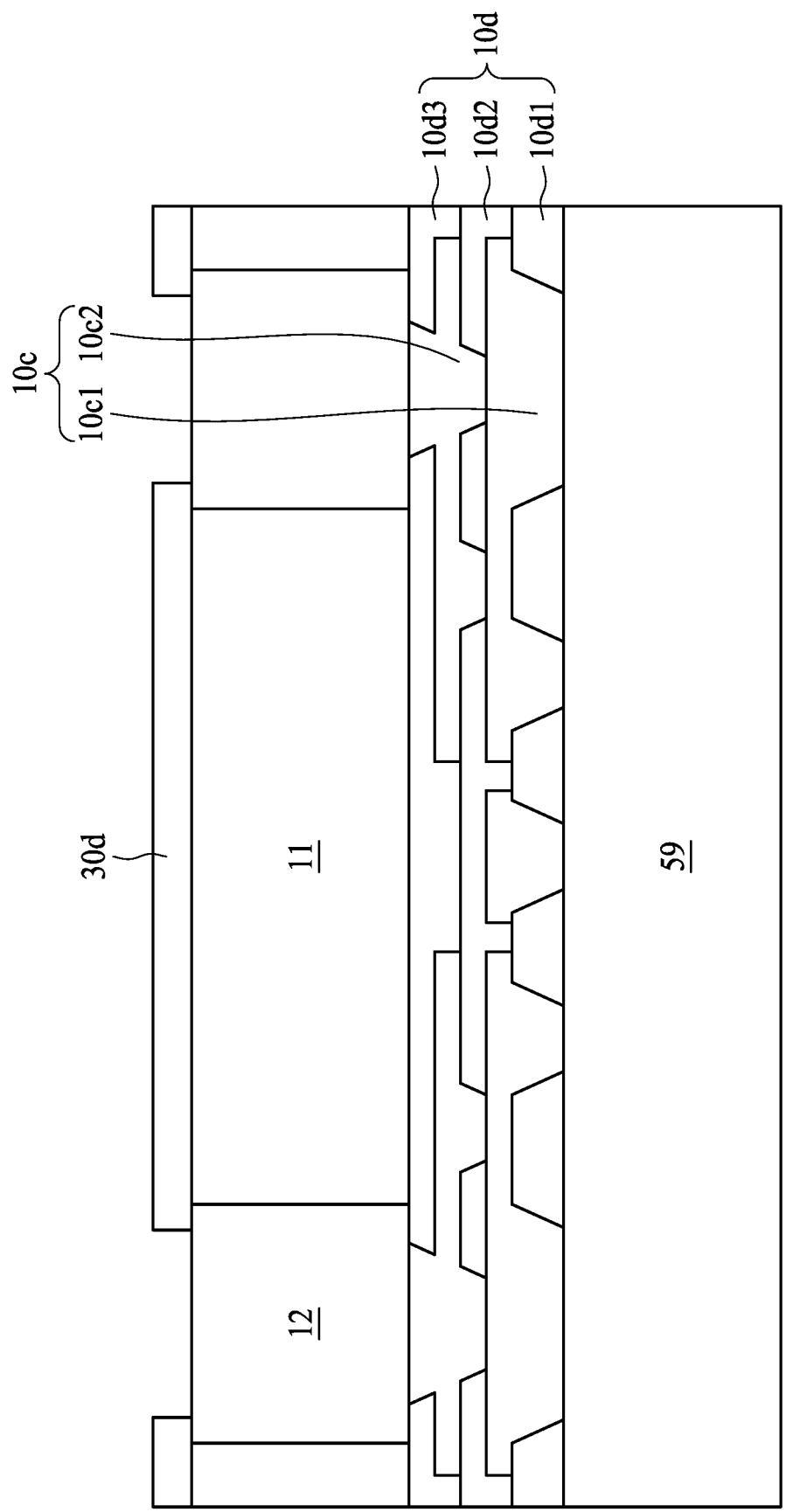
FIG. 6A, FIG. 6B and FIG. 6C illustrate a method for manufacturing an antenna module in accordance with some embodiments of the present disclosure.
Figure 6B:
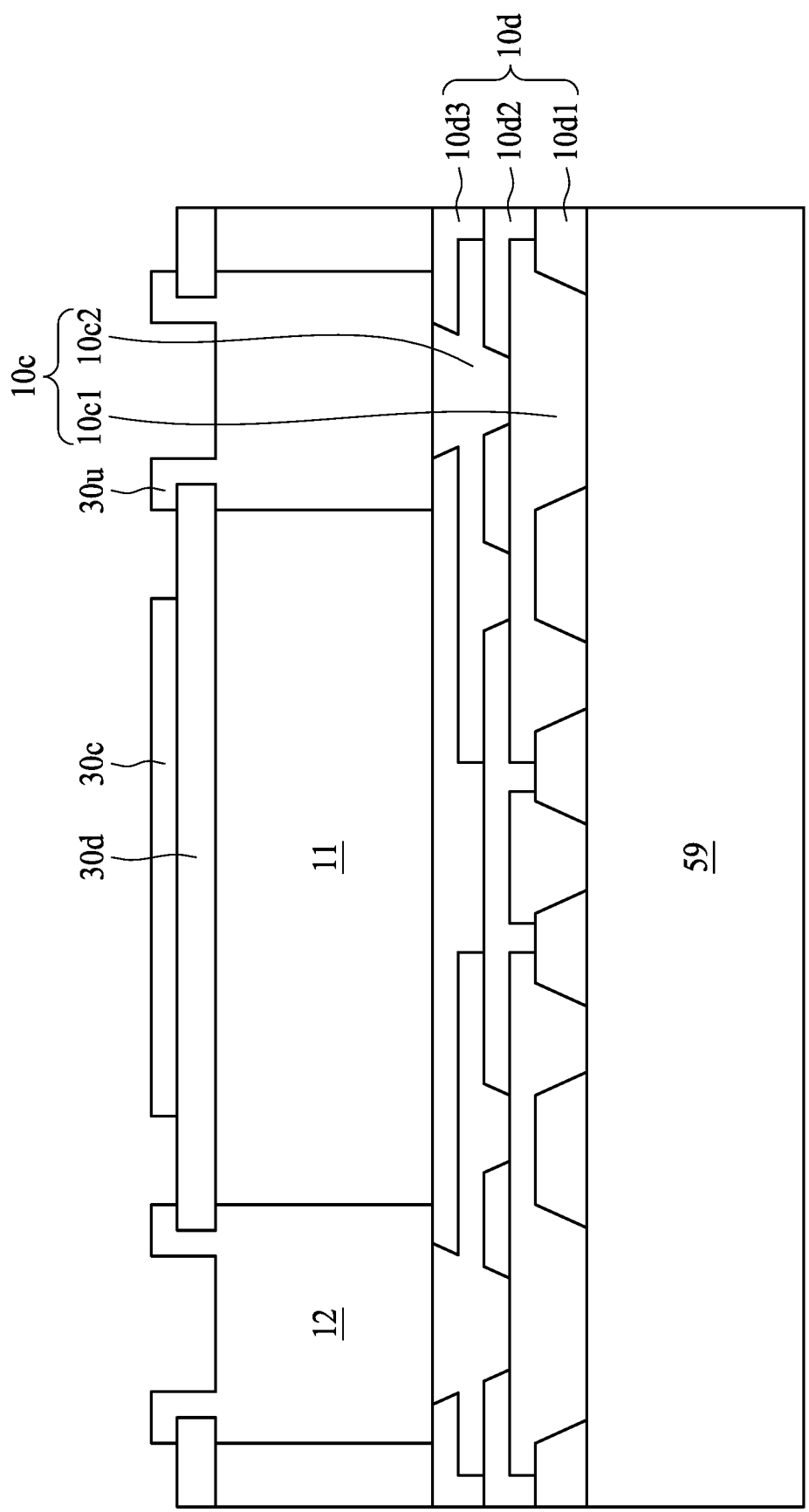
Figure 6C:
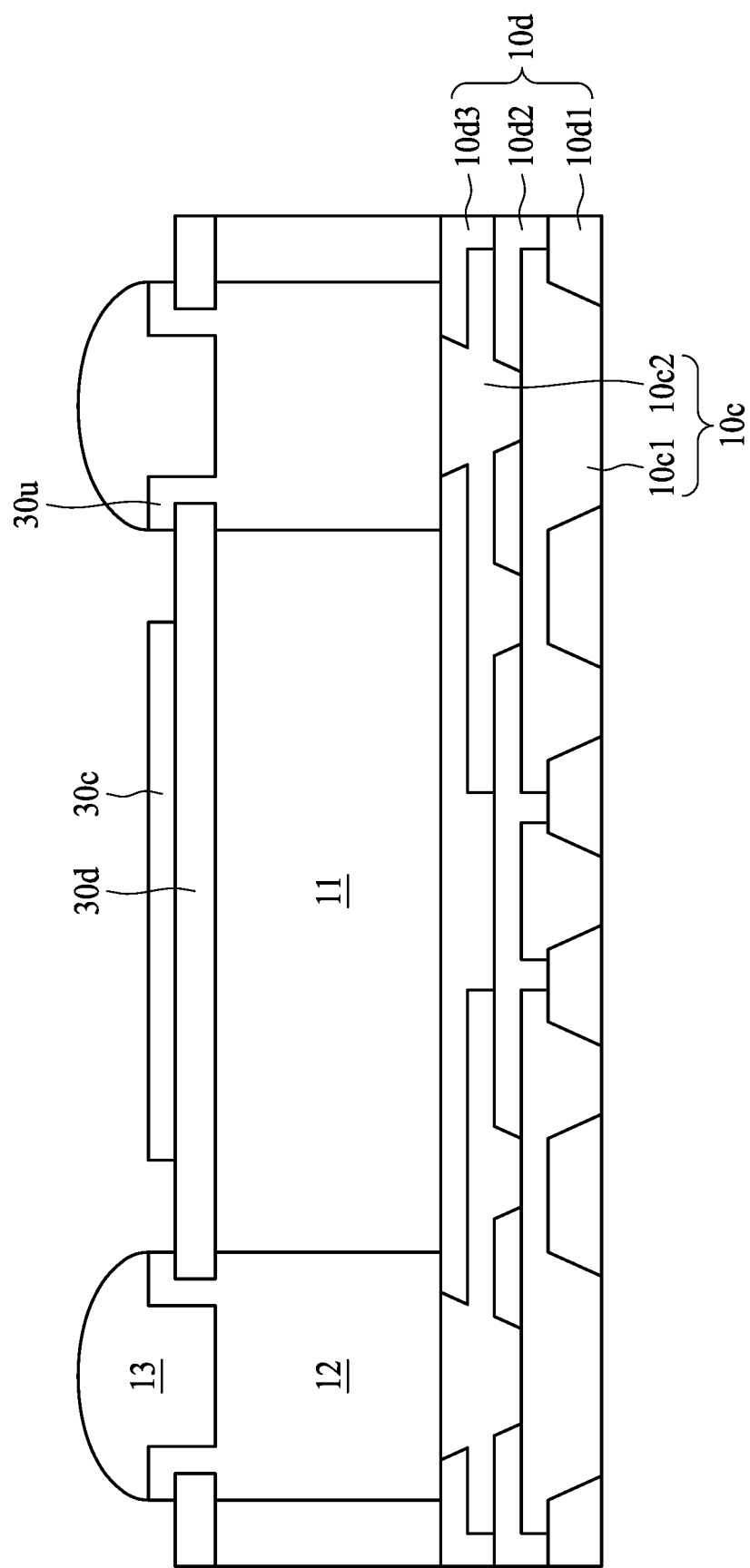

FIG. 6A, FIG. 6B and FIG. 6C illustrate a method for manufacturing an antenna module in accordance with some embodiments of the present disclosure. In some embodiments, the method in FIG. 6A, FIG. 6B and FIG. 6C can be used to manufacture the antenna module 1' as shown in FIG. 3. In other embodiments, the method in FIG. 6A, FIG. 6B and FIG. 6C can be used to manufacture other antenna modules. In some embodiments, the operation in FIG. 6A is performed subsequent to the operation in FIG. 5E.

Referring to FIG. 6A, a dielectric layer 30d is formed on the package body 11. The dielectric layer 30d has one or more openings to expose the top surface of the conductive pillar 12 exposed from the package body 11.

Referring to FIG. 6B, a conductive layer 30u (e.g., UBM layer) is formed on the dielectric layer 30d and extends within the openings defined by the dielectric layer 30d to contact the top surface of the conductive pillar 12. A conductive layer 30c is then formed on the dielectric layer 30d.

Referring to FIG. 6C, an electrical contact 13 is formed on the UBM layer 30u. The carrier 59 is then removed to form the antenna module 1' as shown in FIG. 3.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a substrate; and
    an antenna module disposed over the substrate, the antenna module comprising:
        a supporting element;
        an antenna pattern disposed over the supporting element;
        a pad;
        a conductive pillar penetrating the supporting element and electrically connecting the antenna pattern to the pad;
        a first dielectric layer disposed below the supporting element and having an opening; and
        an electrical contact partially disposed within the opening of the first dielectric layer, and connecting the pad and the substrate,
        wherein a lower surface of the pad is exposed from the opening of the first dielectric layer, and the pad directly contacts the conductive pillar and the electrical contact.

2. The semiconductor device package of claim 1, wherein the antenna module includes a second dielectric layer in contact with lateral surfaces of the antenna pattern, wherein the second dielectric layer includes a portion vertically overlapping the antenna pattern in a cross-sectional view, wherein a thickness of the portion of the second dielectric layer is less than a thickness of antenna pattern.

3. The semiconductor device package of claim 1, wherein the antenna pattern includes a first portion and a second portion separated from the first portion by a third dielectric layer, wherein a width of the first portion is different from a width of the second portion in a cross-sectional view.

4. The semiconductor device package of claim 3, wherein the antenna pattern further includes a third portion separated from the first portion and the second portion by the third dielectric layer, wherein the first portion is between the second portion and the third portion, and wherein the width of the first portion is different from a width of the third portion.

5. The semiconductor device package of claim 4, wherein a horizontal distance between the first portion and the second portion of the antenna pattern is different from a horizontal distance between the first portion and the third portion of the antenna pattern.

6. The semiconductor device package of claim 3, further comprising an electronic component disposed under the substrate and vertically overlapping the first portion and the second portion of the antenna pattern.

7. A semiconductor device package, comprising:
    a substrate;
    a first antenna module disposed over the substrate, the first antenna module including:
        a supporting element;
        an antenna pattern disposed over the supporting element, wherein the antenna pattern has a first lateral surface non-perpendicular to a top surface of the substrate in a cross-sectional view;
        a conductive pillar within the supporting element; and
        a conductive layer disposed between the antenna pattern and the supporting element and connecting the conductive pillar to the antenna pattern; and
    a second antenna module disposed over the substrate and spaced apart from the first antenna module.

8. The semiconductor device package of claim 7, wherein the antenna pattern has a second lateral surface opposite to and non-parallel to the first lateral surface.

9. The semiconductor device package of claim 7, wherein a first width of the antenna pattern at a first elevation is less than a second width of the antenna pattern at a second elevation in a cross-sectional view, wherein the second elevation is lower than the first elevation with respect to the substrate.

10. The semiconductor device package of claim 7, wherein the conductive pillar is electrically connected to a feeding point of the antenna pattern for signal transmission.

* * * * *